(12) United States Patent
Oyu

(10) Patent No.: US 11,394,173 B2
(45) Date of Patent: Jul. 19, 2022

(54) WAVELENGTH BEAM COMBINING DEVICE INCLUDING OUTPUT CONTROL UNIT FOR CONTROLLING LIGHT SOURCE UNIT TO HAVE VARIABLE OUTPUT

(71) Applicant: NICHIA CORPORATION, Anan (JP)

(72) Inventor: Takahiro Oyu, Chiyoda-ku (JP)

(73) Assignee: NICHIA CORPORATION, Anan (JP)

( * ) Notice: Subject to any disclaimer, the term of this patent is extended or adjusted under 35 U.S.C. 154(b) by 47 days.

(21) Appl. No.: 16/137,393

(22) Filed: Sep. 20, 2018

(65) Prior Publication Data

US 2019/0089130 A1 Mar. 21, 2019

(30) Foreign Application Priority Data

Sep. 21, 2017 (JP) .............................. JP2017-181176

(51) Int. Cl.
*H01S 5/14* (2006.01)
*H01S 5/40* (2006.01)
*H01S 5/062* (2006.01)
*H01S 5/024* (2006.01)

(52) U.S. Cl.
CPC .......... *H01S 5/143* (2013.01); *H01S 5/06213* (2013.01); *H01S 5/4012* (2013.01); *H01S 5/4062* (2013.01); *H01S 5/4068* (2013.01); *H01S 5/02469* (2013.01); *H01S 5/405* (2013.01); *H01S 5/4087* (2013.01)

(58) Field of Classification Search
CPC .... H01S 5/4012; H01S 5/4062; H01S 5/4068; H01S 5/06213; H01S 5/405; H01S 5/02469; H01S 5/143; H01S 5/4087
See application file for complete search history.

(56) References Cited

U.S. PATENT DOCUMENTS

| | | | |
|---|---|---|---|
| 6,192,062 B1 | 2/2001 | Sanchez-Rubio et al. | |
| 2013/0156052 A1* | 6/2013 | Diehl | H01S 5/02461 372/20 |
| 2015/0331245 A1* | 11/2015 | Tayebati | G02B 5/18 359/634 |
| 2015/0333485 A1* | 11/2015 | Tayebati | H01S 5/4068 359/487.04 |
| 2018/0193955 A1* | 7/2018 | Karp | B33Y 30/00 |
| 2019/0214786 A1* | 7/2019 | Whitmore | H01S 5/4031 |

FOREIGN PATENT DOCUMENTS

JP 2014-017337 1/2014

* cited by examiner

*Primary Examiner* — M. A. Golub-Miller
(74) *Attorney, Agent, or Firm* — Foley & Lardner LLP

(57) ABSTRACT

A wavelength beam combining device includes: a light source unit comprising a plurality of laser light sources, each being configured to emit a laser beam with a predetermined wavelength width; a light condensing member configured to condense the laser beams emitted from the light source unit; a diffraction grating on which the laser beams condensed by the light condensing member are incident; a resonator mirror disposed in an optical path of a diffracted beam from the diffraction grating; and an output control unit configured to turn off, among the plurality of laser light sources, at least laser light sources located farthest from an optical axis of the light condensing member, to reduce an output of the wavelength beam combining device relative to an output of the wavelength beam combining device when all the plurality of laser light sources are turned on.

11 Claims, 7 Drawing Sheets

WAVELENGTH BEAM COMBINING DEVICE INCLUDING OUTPUT CONTROL UNIT FOR CONTROLLING LIGHT SOURCE UNIT TO HAVE VARIABLE OUTPUT

CROSS-REFERENCE TO RELATED APPLICATION

This application claims priority pursuant to 35 U.S.C. § 119 from Japanese Patent Application No. 2017-181176, filed on Sep. 21, 2017, the entire disclosure of which is incorporated herein by reference.

BACKGROUND

Technical Field

The present disclosure relates to a wavelength beam combining (WBC) device.

Related Art

There is an increase in demand for light source devices that emit a high-power laser in various fields including laser processing, such as laser welding. Examples of light source devices that emit a high-power laser include wavelength beam combining devices (hereinafter also referred to as "WBC devices"). U.S. Pat. No. 6,192,062 (hereinafter referred to as the '062 patent) describes a structure of a WBC device. The WBC device described in the '062 patent includes a light source unit (such as a laser diode (LD) bar) in which a plurality of laser light sources (such as LDs) are arranged, each laser light source being configured to emit light with a specified wavelength width; a light condensing member (such as a condensing lens) that condenses the laser beams emitted from the laser light sources; a diffraction grating on which the laser beams condensed by the light condensing member are incident; and a partially reflecting mirror disposed in the optical path of the diffracted beam from the diffraction grating. A rear mirror of the laser light sources and the partially reflecting mirror form an external resonator, and light travels back and forth between the rear mirror and the partially reflecting mirror, so that light is amplified.

SUMMARY

A WBC device can output a high-power laser beam. However, a laser device is not always used at the maximum output, and the output is varied in accordance with the use of the laser device. The output of the WBC device can be reduced generally by reducing the current value flowing through the LDs. Meanwhile, adjustment of the current value to change the output of the WBC device may lead to an unstable state of the WBC device. For example, in the case in which alignment in the WBC device is performed in accordance with the current value at the maximum output of the WBC device and thus a stable external resonance condition is obtained, reduction in the current value in order to reduce the output of the device may result in a failure to perform a stable external resonance, so that advantages of the WBC device may not be exploited.

One object of the present disclosure is to provide a WBC device in which the output can be adjusted without impairing the characteristics of the WBC device.

In one embodiment of the present invention, a wavelength beam combining device includes a light source unit, a light condensing member, a diffraction grating, a resonator mirror, and an output control unit. The light source unit includes a plurality of laser light sources, each of the plurality of laser light sources being configured to emit light with a predetermined wavelength width. The light condensing member condenses the laser beams emitted from the light source unit. The laser beams condensed by the light condensing member are incident on the diffraction grating. The resonator mirror is disposed in an optical path of a diffracted beam from the diffraction grating, the resonator mirror having an optical axis aligned with an optical axis of the diffracted beam. The output control unit is configured to turn off, among the plurality of laser light sources, at least laser light sources located farthest from an optical axis of the light condensing member, to reduce an output of the wavelength beam combining device from an output of the wavelength beam combining device when all the plurality of laser light sources are turned on.

In the WBC device according to the above-described embodiment of the present invention, the output is reduced by, instead of reducing the current value flowing through the laser light sources, turning off, among the plurality of laser light sources, at least laser light sources located farthest from the optical axis, which allows stable adjustment of output.

A more complete appreciation of the disclosure and many of the attendant advantages thereof may be readily obtained by reference to the following detailed description when considered in connection with the accompanying drawings.

Figure 1:
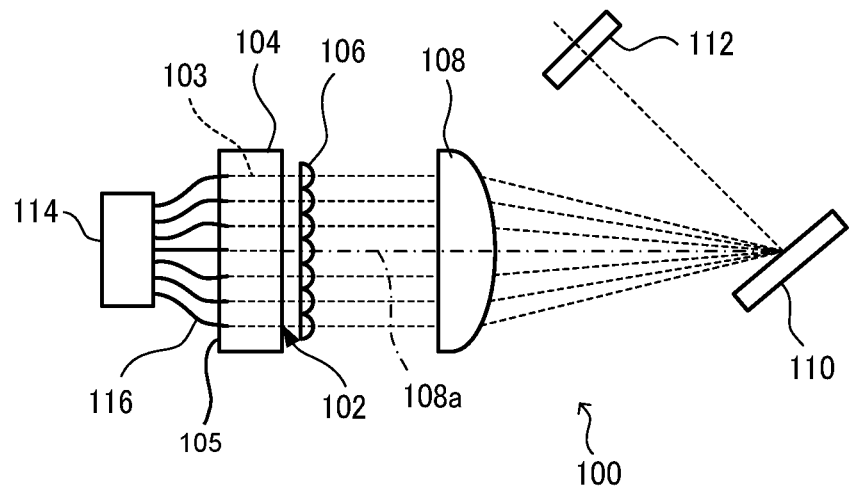
FIG. 1 is a schematic diagram of a wavelength beam combining device according to a first embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity.

However, the disclosure of the present specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

Embodiments of the present disclosure are described below with reference to the drawings, in which like reference numerals designate identical or corresponding parts throughout the several views.

FIG. 1 is a schematic diagram of a wavelength beam combining device according to a first embodiment. The WBC device 100 includes a laser diode bar 104, a collimator 106, a light condensing member 108, a diffraction grating 110, a resonator mirror 112, and an output control unit 114.

Figure 2:
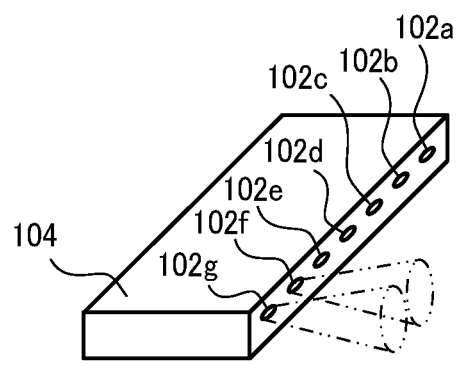
FIG. 2 is a perspective diagram schematically illustrating a laser diode bar in the wavelength beam combining device in FIG. 1.

FIG. 2 is a perspective diagram schematically illustrating the laser diode bar in the wavelength beam combining device in FIG. 1.

The laser diode bar 104 includes a plurality of laser diodes formed on the same substrate and arranged laterally in a row. The laser diode is an example of a laser light source. In FIG. 1, each of the laser diodes is indicated by a respective one of waveguides 103. The laser diode bar 104 has light emitting portions 102, each of which is located at an end of a respective one of the waveguides 103 in a plan view. Light with a predetermined wavelength width is emitted from each of the light emitting portions 102. Thus, in this specification, each light emitting portion 102 is considered a "laser light source". In other words, the laser diode bar 104 includes a plurality of light emitting portions 102 (that is, a plurality of laser light sources) arranged laterally in a row. The laser diode bar 104 is an example of a light source unit.

In FIG. 2, laser beams emitted from the light emitting portions 102 are schematically illustrated with dash-double-dot lines. An example of a laser light source configured to emit light with a predetermined wavelength width is a laser light source with a center wavelength of 405 nm and a gain (i.e., wavelength width) Δλ of 10 nm. With such a light source, the wavelength range of the laser light emitted from the light emitting portions 102 is 400 to 410 nm. In this specification, emitting a laser beam from the light emitting portions 102 may be referred to as "turning on," and a state of not emitting a laser beam may be referred to as "turning off."

For ease of explanation, in FIG. 2, the light emitting portions 102 are denoted by reference numbers 102a, 102b, ..., 102g in order from the right side to the left side of FIG. 2. This order corresponds to the order of the light emitting portions 102 in FIG. 1 from the top side to the bottom side of FIG. 1.

The collimator 106 collimates the laser beams emitted from the light emitting portions 102 into substantially parallel beams. The collimator 106 may include, for example, collimation lenses, each disposed at a side of a corresponding one of the light emitting portions 102. A single lens or a combination lens, in which a plurality of lenses are combined, may be used for each portion of the collimator 106 corresponding to a respective light emitting portion 102. The collimator 106 may include a lens array of collimation lenses that are arranged laterally in a row, each corresponding to a respective one of light emitting portions 102.

The light condensing member 108 condenses laser beams that have been emitted from the light emitting portions 102 and have passed through the collimator 106. The light condensing member 108 may include a single condensing lens, a combination lens, in which a plurality of lenses are combined, or a mirror. The light condensing member 108 may include a spherical lens.

In FIG. 1, the optical axis 108a of the light condensing member 108 is indicated by a dash-dot line. As illustrated in FIG. 1 and FIG. 2, the optical axis 108a of the light condensing member 108 is aligned with the optical axis of the light emitting portion 102d, which is the center light emitting portion of the light emitting portions 102, of the laser diode bar 104. The laser beams are condensed by the light condensing member 108 and are incident on the diffraction grating 110. With the collimator 106 that collimates the laser beams emitted from the light emitting portions 102 into substantially parallel beams, a condensing effect of the light condensing member 108 can be increased. The collimator 106 is optionally provided.

The diffraction grating 110 diffracts and combines the laser beams, which is condensed by the light condensing member 108 and incident on the diffraction grating 110 at different incident angles, in the direction of the same diffraction angle. The resonator mirror 112 is disposed in the optical path of the diffracted beam such that the optical axis of the resonator mirror 112 is aligned with the optical axis of the diffracted beam from the diffraction grating 110. The resonator mirror 112 may be a partially reflecting mirror that reflects a portion of the light. A rear mirror 105 in the laser diode bar 104 and the resonator mirror 112 form an external resonator, and light travels back and forth between them to be amplified.

The output control unit 114 controls the current flowing to each laser diode in the laser diode bar 104 through a respective one of wires 116 or the like. Through this process, the output control unit 114 controls the output of the WBC device 100.

Figure 3:
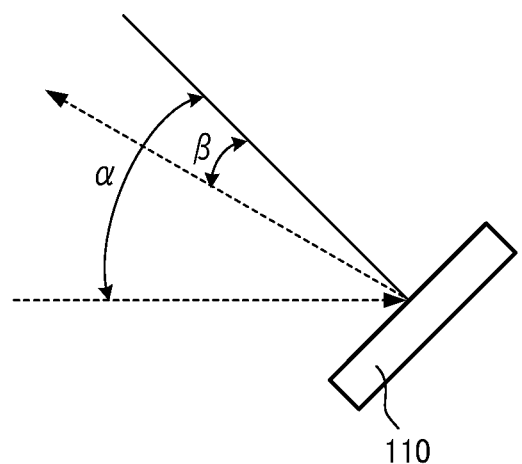
FIG. 3 is a schematic diagram illustrating the incident angle of an incident beam that is incident on a diffraction grating and the diffraction angle of the diffracted beam.

As illustrated in FIG. 1, in the WBC device 100, the laser beams emitted from the light emitting portions 102 are condensed by the light condensing member 108 and incident on an area of the diffraction grating 110 at different incident angles. Of the beams incident at respective angles, the diffracted beams with predetermined wavelength components are diffracted at the same diffraction angle and combined. This process is described using FIG. 3. FIG. 3 is a schematic diagram illustrating the incident angle of an incident beam incident on the diffraction grating and illustrating the diffraction angle of the diffracted beam. When α is the incident angle of the incident beam incident on the diffraction grating 110, and β is the diffraction angle of the diffracted beam diffracted by the diffraction grating 110, the relationship in Formula 1 as below can be satisfied:

$$\sin \alpha + \sin \beta = N \cdot m \cdot \lambda \quad \text{(Formula 1)}$$

where α is the incident angle, β is the diffraction angle, N is the number of slits in the diffraction grating at each 1 mm, m is the diffraction order, and λ is the wavelength of the beam.

For example, when a laser beam with a center wavelength of 405 nm and a wavelength range of 402 nm to 408 nm is emitted from each light emitting portion 102 and the number of slits in the diffraction grating 110 is 2400, the incident angles α with which wavelength components of 402 nm, 403 nm, 404 nm, 405 nm, 406 nm, 407 nm, and 408 nm, which are integers, are diffracted at the same diffraction angle β in a first-order diffraction are as shown in Table 1.

TABLE 1

| λ(nm) | α(degree) | β(degree) |
|---|---|---|
| 402 | 44.42 | 15.36 |
| 403 | 44.61 | 15.36 |
| 404 | 44.80 | 15.36 |
| 405 | 45.00 | 15.36 |
| 406 | 45.20 | 15.36 |
| 407 | 45.39 | 15.36 |
| 408 | 45.59 | 15.36 |

For example, when the laser beams emitted from the light emitting portions 102a, 102b, 102c, 102d, 102e, 102f, and 102g pass through the light condensing member 108 and are incident on the diffraction grating 110 at incident angles of 44.42, 44.61, 44.80, 45.00, 45.20, 45.39, and 45.59 degrees, respectively, as shown in a column of the incident angle α in Table 1, a wavelength component of 402 nm of the beam emitted from the light emitting portion 102a is diffracted at a diffraction angle of 15.36 degrees. Wavelength components of 403 nm, 404 nm, 405 nm, 406 nm, 407 nm, and 408 nm of the beams emitted from the light emitting portions 102b, 102c, 102d, 102e, 102f, and 102g are diffracted at the same diffraction angle of 15.36 degrees, as shown in Table 1.

The resonator mirror 112 is disposed perpendicular to the direction of the diffraction angle. External resonance of each of the laser diodes at respective wavelength occurs between the rear mirror 105 and the resonator mirror 112. Accordingly, the WBC device 100 can emit a combined laser beam in which the individual laser beams are combined at the same diffraction angle.

Figure 4:
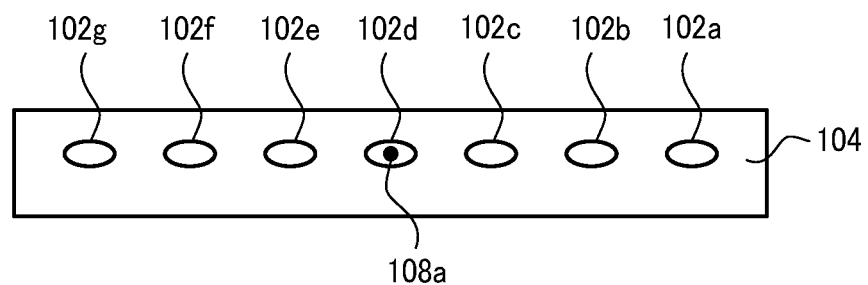
FIG. 4 is a schematic front view of the laser diode bar in FIG. 2.

FIG. 4 is a schematic front view of the laser diode bar illustrated in FIG. 2. The optical axis 108a of the light condensing member 108 is aligned with the optical axis of the light emitting portion 102d, which is located at the center of the laser diode bar 104. In the figures, light emitting portions 102 shaded in black indicate ones that are turned off, and light emitting portions 102 not shaded in black indicate ones that are turned on. Thus, FIG. 4 illustrates the state where all the laser diodes in the laser diode bar 104 are turned on, in other words, the state where the WBC device is driven at the maximum output.

Figure 5A:
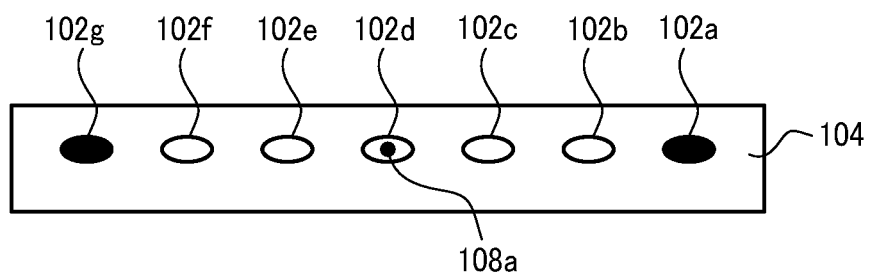
FIGS. 5A and 5B are schematic diagrams illustrating a control process to reduce in steps the output of the wavelength beam combining device.
Figure 5B:
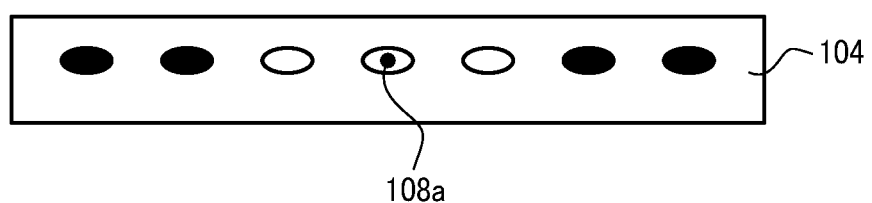

FIGS. 5A and 5B are schematic diagrams illustrating a control process for gradually reducing the output of the wavelength beam combining device. When using the WBC device 100 at an output less than the maximum output of the WBC device 100, the output control unit 114 turns off at least the outermost light emitting portions of the light emitting portions 102 located farthest from the optical axis 108a of the light condensing member 108 (hereinafter also referred to as "the outermost laser diodes"), so that the output of the WBC device 100 is reduced from when all of the light emitting portions 102 are turned on (i.e., the maximum output of the WBC device 100).

In the laser diode bar 104, the light emitting portions located furthest from the optical axis 108a of the light condensing member 108 are the light emitting portions 102a and 102g. Thus, the output control unit 114 can reduce the output by turning off light emitting portions in order starting from the light emitting portions 102a and 102g to the light emitting portion 102d, which is located on the optical axis. For example, the light emitting portions 102a and 102g are turned off as illustrated in FIG. 5A. In the case of further reducing the output, subsequently, the light emitting portions 102b and 102f are further turned off, as shown in FIG. 5B. The light emitting portions 102a, 102b, 102f, and 102g may be turned off at the same time as necessary.

Figure 6A:
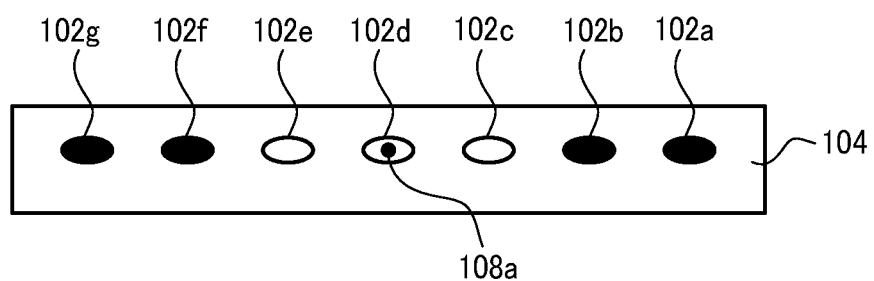
FIGS. 6A and 6B are schematic diagrams illustrating a control process to increase in steps the output of the wavelength beam combining device.
Figure 6B:
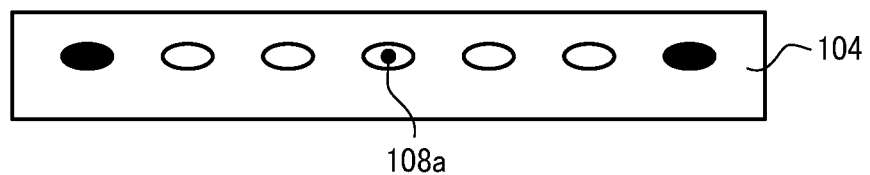

FIGS. 6A and 6B are schematic diagrams illustrating a control process for gradually increasing the output of the wavelength beam combining device. When increasing the output of the WBC device 100 from zero, light emitting portions 102 are turned on in order starting from the ones located closest to the optical axis 108a of the light condensing member 108 (hereinafter also referred to as "the innermost laser diodes"), so that the output control unit 114 increases the output. For example, as illustrated in FIG. 6A, the light emitting portions 102c, 102d, and 102e, which is nearest the optical axis 108a, are turned on. In the case of further increasing the output, subsequently, the light emitting portions 102b and 102f are further turned on, as shown in FIG. 6B. The light emitting portions 102b to 102f may be turned on at the same time as necessary.

The output control unit 114 may be a switch configured to turn on and off the current flowing through the laser diodes in the laser diode bar 104 in a plurality of steps. For example, in the present embodiment, the output control unit 114 is a four-step switch. The first step of the four-step switch corresponds to the off state, in which all the light emitting portions 102 in the laser diode bar 104 are turned off. The second step of the four-step switch corresponds to the state in which the light emitting portions 102c to 102e are turned on, and the other light emitting portions 102a, 102b, 102f, and 102g are turned off, as illustrated in the upper diagram in FIG. 6A. The third step of the four-step switch corresponds to the state in which the light emitting portions 102a and 102g are turned off, and the light emitting portions 102b to 102f are turned on, as illustrated in FIG. 6B. The fourth step of the four-step switch corresponds to the maximum output state in which all the light emitting portions 102 are turned on as illustrated in FIG. 4. Switching between the four steps may be performed manually or automatically.

When the WBC device 100 according to this embodiment emits a laser beam at an output other than the maximum output, the output of the WBC device 100 according to this embodiment is set not by adjusting the current flowing through the laser diodes in the laser diode bar 104 but by turning off the outermost laser diodes (i.e., outermost light emitting portions) of the laser diodes included in the laser diode bar 104. Thus, it is possible to avoid instability of the device caused by changing a value of a current flowing through the laser diodes.

The output can be adjusted by changing the number of light emitting portions turned off. The light emitting portions that are turned on are always located inward of the light emitting portions that are turned off. For example, as described above, when the wavelength components of 402, . . . , 405, . . . , and 408 nm among the beams emitted from the light emitting portions 102a, . . . , 102d, . . . , and 102g are diffracted at the same diffraction angle and combined, the wavelength range subjected to the beam combining is 402 to 408 nm. In the case in which the output control unit 114 turns off the light emitting portions 102a and 102g as illustrated in FIG. 5A, the wavelength range subjected to the beam combining is 403 to 407 nm. In the case in which the output control unit 114 turns off the light emitting portions 102a, 102b, 102f, and 102g as illustrated in FIG. 5B, the wavelength range subjected to the beam combining is 404 to 406 nm. In other words, the less the output of the WBC device 100 is, the narrower the wavelength range subjected to the beam combining is toward the center wavelength.

Thus, when the output of the WBC device according to this embodiment is less than the maximum output thereof, chromatic aberration occurring when the emitted beams pass through the condensing lens or the like can be reduced from the maximum output. It is also possible to reduce the effect of spherical aberration that occurs when a spherical lens is used. Reduction in the output of the WBC device according to this embodiment allows for combining, among all the beams emitted from the light emitting portions, only beams with wavelengths closest to the center wavelength, which have a great intensity and easily resonate. Thus, the WBC device according to this embodiment allows for providing stable output.

Figure 7:
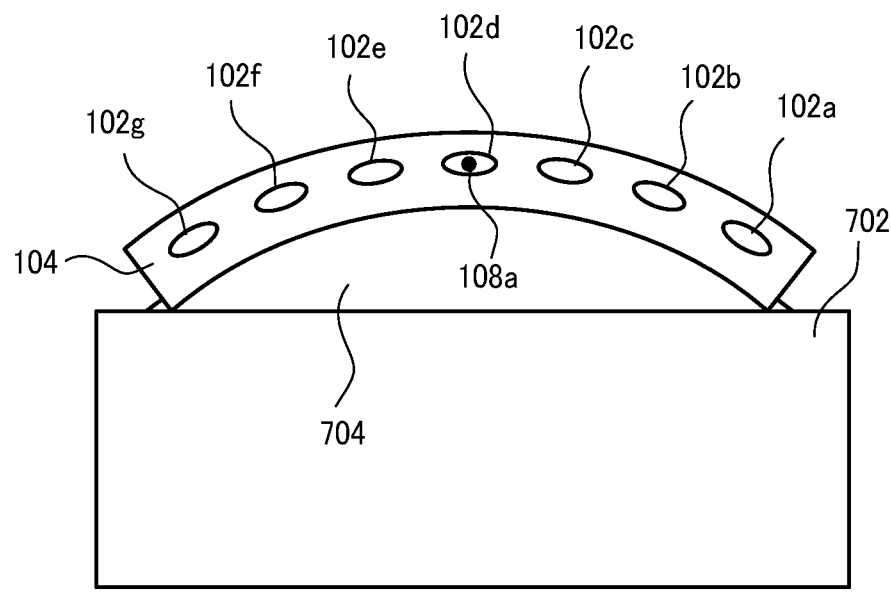
FIG. 7 is a schematic diagram illustrating a deformed laser diode bar as viewed from the optical axis direction.

FIG. 7 is a schematic diagram illustrating a deformed laser diode bar when viewed in the optical axis direction. The laser diode bar 104 is generally attached to a metal heat sink 702 for cooling, using a bonding member 704 such as solder. Although it is ideal for all of the light emitting portions 102 in the laser diode bar 104 have the same height, unevenness of the attachment and the thermal deformation due to heating, cooling, and the like may cause variation in heights of the light emitting portions 102 by several microns. As illustrated in FIG. 7, a typical example in which such a variation in heights of the light emitting portions 102 occurs is a warpage called "smile warpage", in which the light emitting portion 102d at the center of the laser diode bar 104 is located highest and the light emitting portions 102a and 102g are located lowest.

With the laser diode bar 104 having such a smile warpage, for example, if the optical axis 108a of the light condensing member 108 is aligned with the optical axis of the light emitting portion 102d, which is located highest, and the height of the lens array of the collimator 106 is also adjusted to the height of the light emitting portion 102d, then the optical axes of the collimation lenses corresponding to light emitting portions 102 other than the light emitting portion 102d are offset from the optical axes of the light emitting portions. The laser beams that have passed through such collimation lenses propagate offset from the optical axes of the collimation lenses. Accordingly, the beam parameter product (BPP) of the obtained combined beam is increased, and thus the quality of the beam is impaired.

On the other hand, the output of the WBC device according to the first embodiment is reduced by turning off the outermost laser diodes (i.e., outermost light emitting portions), each of which has the optical axis greatly offset from the optical axis 108a of the light condensing member 108 and the collimator 106 in the height direction, so that the WBC device according to the first embodiment can provide a high-quality beam having a small BPP.

Figure 8:
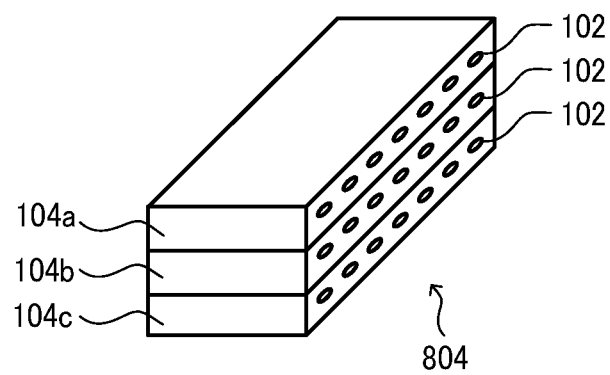
FIG. 8 is a perspective diagram schematically illustrating a laser diode stack in a wavelength beam combining device according to a second embodiment.

FIG. 8 is a perspective diagram schematically illustrating a laser diode stack in a wavelength beam combining device according to a second embodiment. The laser diode stack 804 includes the plurality of laser diode bars 104 stacked vertically. For convenience of explanation, the laser diode bars 104 in FIG. 8 are denoted by the numbers 104a, 104b, and 104c. The second embodiment is a modification of the first embodiment. The main difference from the first embodiment is that the laser diode stack 804, instead of the laser diode bar 104, is used as a light source unit.

The wavelength beam combining device according to the second embodiment can also be as schematically shown in FIG. 1, when the laser diode bar 104 is replaced by the laser diode stack 804, which serves as the light source unit. In this embodiment, current is flowed through each laser diode in the laser diode stack 804 via a respective one of the wires 116 or the like. An output control unit 114 controls turning-on and turning-off of the current flowing through each laser diode, and thus controls turning-on and turning-off of the laser diode. Accordingly, the output of the WBC device is controlled.

Figure 9A:
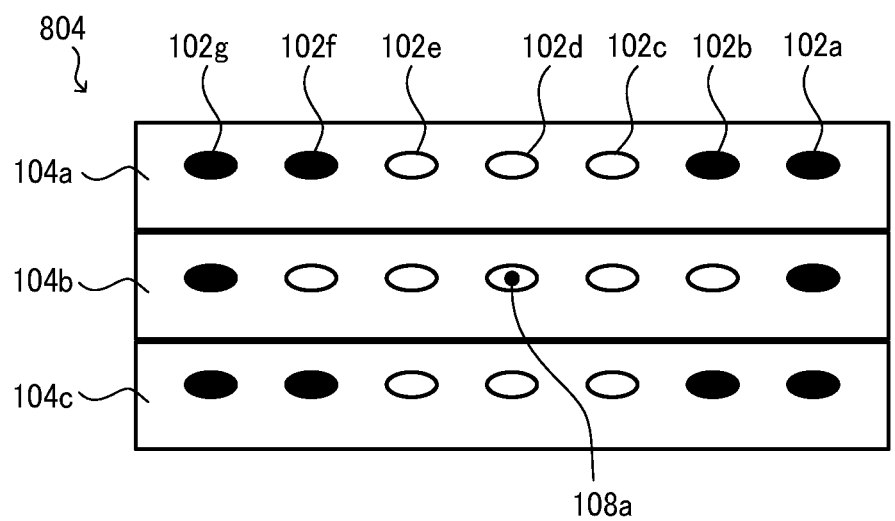
FIGS. 9A and 9B are schematic diagrams illustrating a control process to reduce in steps the output of the wavelength beam combining device in the second embodiment.
Figure 9B:
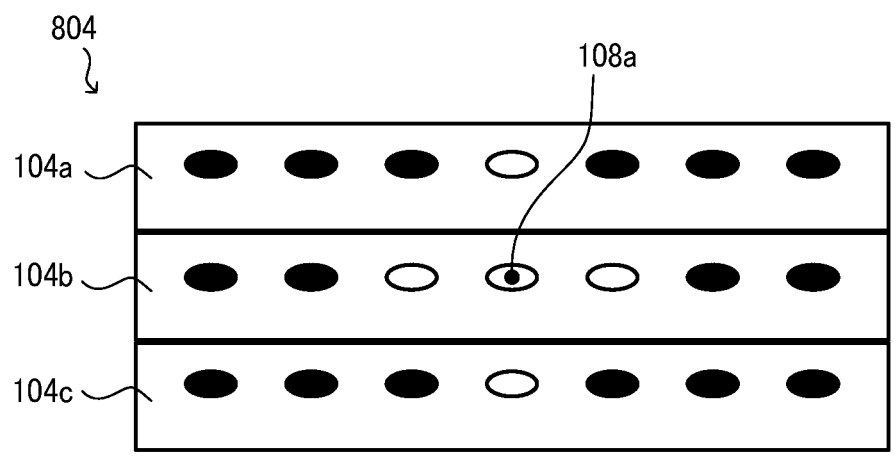

FIGS. 9A and 9B are schematic diagrams illustrating a control process for gradually reducing the output of the wavelength beam combining device in the second embodiment. As illustrated in FIGS. 9A and 9B, in the second embodiment, the optical axis 108a of the light condensing member 108 is aligned with the optical axis of the light emitting portion 102d, which is located at the center of the laser diode bar 104b, which is the middle laser diode bar of the laser diode stack 804. The output control unit 114 turns off, among the light emitting portions 102, at least light emitting portions located farthest from the optical axis 108a of the light condensing member 108 (i.e., outermost light emitting portions) to reduce the output of the WBC device from the output of the WBC device with all the light emitting portions 102 turned on (i.e., the maximum output of the WBC device).

More specifically, when reducing the output of the WBC device, the output control unit 114 turns off the light emitting portions 102a and 102g, which are located farthest from the optical axis 108a, in each laser diode bar 104 and also turns off the light emitting portions 102b and 102f in the laser diode bars 104a and 104c as illustrated in FIG. 9A.

When further reducing the output, the output control unit 114 further turns off the light emitting portions 102c and 102e in the laser diode bars 104a and 104c and also turns off the light emitting portions 102b and 102f in the laser diode bar 104b as illustrated in FIG. 9B.

When increasing the output of the WBC device, conversely to reducing the output, the output control unit 114 turns on light emitting portions in order from light emitting portions located closest to the optical axis 108a of the light condensing member 108 (i.e., innermost light emitting portions) to increase the output. The WBC device according to the second embodiment can exhibit the same effect as the WBC device according to the first embodiment, and accordingly, the description of the effect thereof is omitted.

Figure 10A:
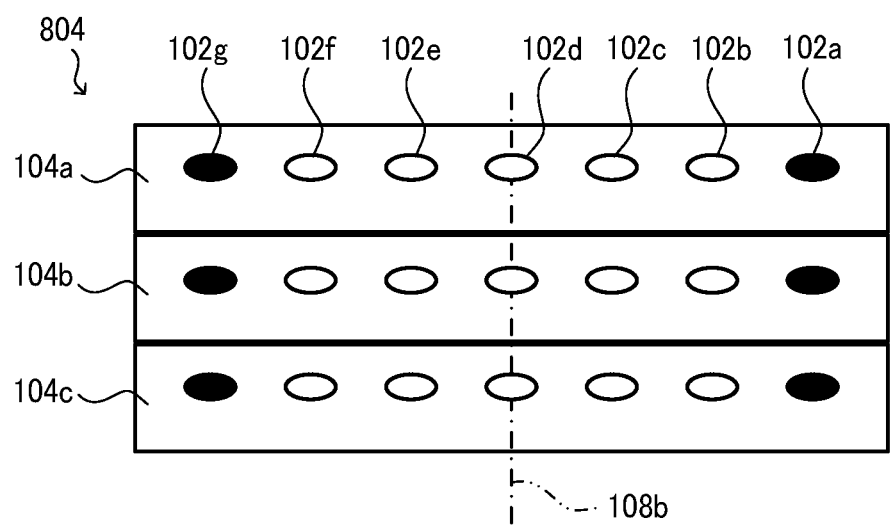
FIGS. 10A and 10B are schematic diagrams illustrating a control process to reduce in steps the output of a wavelength beam combining device in a third embodiment.
Figure 10B:
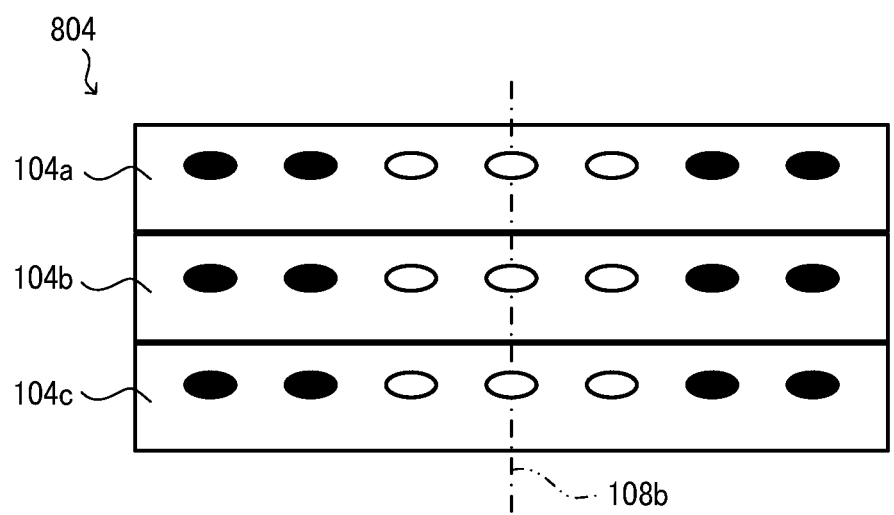

FIGS. 10A and 10B are schematic diagrams illustrating a control process for gradually reducing the output of a wavelength beam combining device in a third embodiment. The third embodiment is a modification of the second embodiment. The main difference from the second embodiment is that the light condensing member 108 includes a cylindrical lens instead of the spherical lens. The wavelength beam combining device according to this embodiment can also be as schematically shown in FIG. 1, while the laser diode bar 104 is replaced by a laser diode stack 804, which serves as a light source unit, and the cylindrical lens is used for the light condensing member 108 instead of the spherical lens.

The output control unit 114 turns off, among the light emitting portions 102, at least light emitting portions located farthest from the optical axis plane 108b of the light condensing member 108 to reduce the output of the WBC device 100 from the maximum output of the WBC device 100. As used herein, the "optical axis plane" refers to a plane that passes through the center axis of the cylinder of the cylindrical lens and which is the plane of symmetry of the image forming system of the cylindrical lens, which is plane-symmetric. In FIGS. 10A and 10B, the optical axis plane 108b is a plane that is represented by the dash-dot line and is perpendicular to the view in FIGS. 10A, and 10B.

More specifically, in the case of reducing the output of the WBC, the output control unit 114 turns off the light emitting portions 102a and 102g, which is located farthest from the optical axis plane 108b of the light condensing member 108, in each laser diode bar 104 as illustrated in FIG. 10A. In the case of further reducing the output, subsequently, the output control unit 114 further turns off the light emitting portions 102b and 102f in each laser diode bar 104 as illustrated in FIG. 10B. The output control unit 114 may turn off the light emitting portions 102a, 102b, 102f, and 102g at the same time as necessary.

In the case of increasing the output of the WBC device, the output control unit 114 turns on light emitting portions, conversely to reducing the output, starting from light emitting portions located closest to the optical axis plane 108b of the light condensing member 108 to increase the output. The WBC device according to the third embodiment exhibits the same effect as that of the WBC device according to the first embodiment, and accordingly, the description of the effect thereof is omitted.

Certain embodiments of the present invention have been described above with reference to exemplary embodiments, and those skilled in the art will recognize that various changes and modifications may be made in form and detail without departing from the scope of the claimed subject matter. The embodiments described above are provided for easy understanding of the present invention, but the present invention is not limited thereto. Some of the configurations in embodiments may be replaced by other configurations, or may be eliminated.

What is claimed is:

1. A wavelength beam combining device comprising:
a laser diode bar comprising a plurality of laser diodes arranged laterally in a row, each being configured to emit a laser beam with a predetermined wavelength width;
a spherical lens configured to condense the laser beams emitted from the laser diode bar, wherein an optical axis of the spherical lens is aligned with an optical axis of a centermost one of the plurality of laser diodes;
a diffraction grating configured to diffract and combine the laser beams that are condensed by the spherical lens and incident on the diffraction grating at different incident angles and to output a diffracted and combined beam at a same diffraction angle;
a resonator mirror disposed in an optical path of the diffracted and combined beam from the diffraction grating, the resonator mirror having an optical axis aligned with an optical axis of the diffracted and combined beam; and
a switch configured to control the laser diode bar so as to operate in at least (i) a first mode, in which all of the plurality of laser diodes emit laser beams, and (ii) a second mode, in which, among the plurality of laser diodes, at least laser diodes located farthest from the centermost laser diode do not emit laser beams, and others of the plurality of laser diodes emit laser beams, such that an output of the wavelength beam combining device during the second mode is lower than an output of the wavelength beam combining device during the first mode;
wherein the switch is configured such that, in every possible mode in which the switch controls the laser diode bar to operate such that one or more of the laser diodes emit laser beams and one or more of the laser diodes do not emit laser beams, the one or more laser diodes that emit laser beams are located inward of the one or more laser diodes that do not emit laser beams;
wherein, a wavelength range of the diffracted and combined beam when the laser diode bar operates in the second mode is narrower than a wavelength range of the diffracted and combined beam when the laser diode bar operates in the first mode; and
wherein the switch is configured to turn on a current flowing through the laser diodes in the laser diode bar in a plurality of steps including:
a first step in which only the centermost laser diode and laser diodes located closest to the centermost laser light source emit laser beams,
a second step in which the laser diode bar operates in the second mode, such that the centermost laser diode, the laser diodes located closest to the centermost laser diode, and laser diodes located adjacent to the laser diodes located closest to the centermost laser diode emit laser beam, while the laser diodes located farthest from the centermost laser diode do not emit laser beams, and
a third step in which the laser diode bar operates in the first mode, such that all of the plurality of laser diodes emit laser beams.

2. The wavelength beam combining device according to claim 1, further comprising:
a collimator disposed between the laser diode bar and the spherical lens and configured to collimate the laser beams emitted from the laser diodes into substantially parallel beams.

3. The wavelength beam combining device according to claim 2, wherein:
the collimator comprises a lens array of collimation lenses that are arranged laterally in a row.

4. The wavelength beam combining device according to claim 1, wherein:
the resonator mirror is a partially reflecting mirror configured to reflect a portion of the diffracted beam.

5. The wavelength beam combining device according to claim 1, wherein:
the laser diode bar comprises a rear mirror, and
the resonator mirror and the rear mirror of the laser diode bar form an external resonator.

6. The wavelength beam combining device according to claim 1, wherein:
the switch is configured to turn off a current flowing through the laser diodes in the laser diode bar in a plurality of steps including:
a first step in which the laser diode bar operates in the second mode, such that the centermost laser diode, the laser diodes located closest to the centermost laser diode, and laser diodes located adjacent to the laser diodes located closest to the centermost laser diode emit laser beams, while the laser diodes located farthest from the centermost laser diode do not emit laser beams,
a second step in which only the centermost laser diode and laser diodes located closest to the centermost laser diode emit laser beams, and
a third step in which none of the plurality of laser diodes emit laser beams.

7. A wavelength beam combining device comprising:
a laser diode bar comprising a plurality of laser diodes arranged laterally in a row, each being configured to emit a laser beam with a predetermined wavelength width;
a spherical lens configured to condense the laser beams emitted from the laser diode bar, wherein an optical axis of the spherical lens is aligned with an optical axis of a centermost one of the plurality of laser diodes;

a diffraction grating configured to diffract and combine the laser beams that are condensed by the spherical lens and incident on the diffraction grating at different incident angles and to output a diffracted and combined beam at a same diffraction angle;

a resonator mirror disposed in an optical path of the diffracted and combined beam from the diffraction grating, the resonator mirror having an optical axis aligned with an optical axis of the diffracted and combined beam; and a switch configured to control the laser diode bar so as to operate in at least (i) a first mode, in which all of the plurality of laser diodes emit laser beams, and (ii) a second mode, in which, among the plurality of laser diodes, at least laser diodes located farthest from the centermost laser diode do not emit laser beams, and others of the plurality of laser diodes emit laser beams, such that an output of the wavelength beam combining device during the second mode is lower than an output of the wavelength beam combining device during the first mode;

wherein the switch is configured such that, in every possible mode in which the switch controls the laser diode bar to operate such that one or more of the laser diodes emit laser beams and one or more of the laser diodes do not emit laser beams, the one or more laser diodes that emit laser beams are located inward of the one or more laser diodes that do not emit laser beams;

wherein, a wavelength range of the diffracted and combined beam when the laser diode bar operates in the second mode is narrower than a wavelength range of the diffracted and combined beam when the laser diode bar operates in the first mode; and wherein the switch is configured to turn off a current flowing through the laser diodes in the laser diode bar in a plurality of steps including:
 a first step in which the laser diode bar operates in the second mode, such that the centermost laser diode, the laser diodes located closest to the centermost diode, and laser diodes located adjacent to the laser diodes located closest to the centermost laser diode emit laser beams, while the laser diodes located farthest from the centermost laser diode do not emit laser beams,
 a second step in which only the centermost laser diode and laser diodes located closest to the centermost laser diode emit laser beams, and
 a third step in which none of the plurality of laser diodes emit laser beams.

8. The wavelength beam combining device according to claim 7, further comprising:
 a collimator disposed between the laser diode bar and the spherical lens and configured to collimate the laser beams emitted from the laser diodes into substantially parallel beams.

9. The wavelength beam combining device according to claim 8, wherein:
 the collimator comprises a lens array of collimation lenses that are arranged laterally in a row.

10. The wavelength beam combining device according to claim 7, wherein:
 the resonator mirror is a partially reflecting mirror configured to reflect a portion of the diffracted beam.

11. The wavelength beam combining device according to claim 7, wherein:
 the laser diode bar comprises a rear mirror, and
 the resonator mirror and the rear mirror of the laser diode bar form an external resonator.

* * * * *